(12) United States Patent
Bond et al.

(10) Patent No.: US 8,772,884 B2
(45) Date of Patent: *Jul. 8, 2014

(54) INTEGRALLY MOLDED DIE AND BEZEL STRUCTURE FOR FINGERPRINT SENSORS AND THE LIKE

(71) Applicant: Apple Inc., Cupertino, CA (US)

(72) Inventors: Robert Henry Bond, Plano, TX (US); Alan Kramer, Berkeley, CA (US); Giovanni Gozzini, Berkeley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/960,405

(22) Filed: Aug. 6, 2013

(65) Prior Publication Data
US 2013/0320464 A1 Dec. 5, 2013

Related U.S. Application Data

(63) Continuation of application No. 13/767,141, filed on Feb. 14, 2013, now Pat. No. 8,569,875, which is a continuation of application No. 12/718,880, filed on Mar. 5, 2010, now Pat. No. 8,378,508.

(51) Int. Cl.
*H01L 23/31* (2006.01)

(52) U.S. Cl.
USPC ............................................ 257/415; 438/51

(58) Field of Classification Search
USPC .......... 257/415, 688, 787, E23.129; 382/124; 438/106, 127
See application file for complete search history.

(56) References Cited

U.S. PATENT DOCUMENTS

| | | |
|---|---|---|
| 5,844,287 A | 12/1998 | Hassan et al. |
| 5,862,248 A | 1/1999 | Salatino et al. |
| 5,864,296 A | 1/1999 | Upton |
| 5,942,761 A | 8/1999 | Tuli |
| 6,061,464 A | 5/2000 | Leger |
| 6,097,035 A | 8/2000 | Belongie et al. |
| 6,512,381 B2 | 1/2003 | Kramer |
| 6,636,053 B1 | 10/2003 | Gozzini |
| 6,686,227 B2 | 2/2004 | Zhou et al. |
| 6,787,388 B1 | 9/2004 | Chiu |
| 6,804,121 B2 | 10/2004 | Fischbach et al. |
| 6,980,286 B1 | 12/2005 | Feng |
| 7,147,153 B2 | 12/2006 | Rowe et al. |
| 7,859,116 B1 | 12/2010 | Kelly et al. |
| 8,378,508 B2 * | 2/2013 | Bond et al. ............... 257/787 |

(Continued)

OTHER PUBLICATIONS

Rowe, "A multispectral sensor for fingerprint spoof detection", Sensors, vol. 22, No. 1, Jan. 2005, pp. 2-4.

(Continued)

*Primary Examiner* — Roy Potter
(74) *Attorney, Agent, or Firm* — Allen, Dyer, Doppelt, Milbrath & Gilchrist, P.A. Attorneys at Law (57) ABSTRACT

A biometric sensor device, such as a fingerprint sensor, comprises a substrate to which is mounted a die on which is formed a sensor array and at least one conductive bezel. The die and the bezel are encased in a unitary encapsulation structure to protect those elements from mechanical, electrical, and environmental damage, yet with a portion of the sensor array and the bezel exposed or at most thinly covered by the encapsulation or other coating material structure.

32 Claims, 7 Drawing Sheets

(56) References Cited

U.S. PATENT DOCUMENTS

| | | |
|---|---|---|
| 2007/0122013 A1 | 5/2007 | Setlak et al. |
| 2009/0169071 A1 | 7/2009 | Bond et al. |
| 2010/0127366 A1 | 5/2010 | Bond et al. |
| 2011/0215341 A1 | 9/2011 | Bond et al. |

OTHER PUBLICATIONS

"Validity launches the first customizable LED fingerprint sensor", http://www.validityinc.com/post.aspx?id=147, Jan. 2009, pp. 1-2.

Boschman Technologies, www.boschman.nl/technology/technology.htm, downloaded Mar. 3, 2010, pp. 1-3.

\* cited by examiner

FIG. 10 ure to protect the wirebonds and other components, the die, lead frame, and wirebonds are typically encased in an encapsulation material. This is accomplished by placing the bonded and connected die and lead frame in a mold, injecting the encapsulation material into the mold, and hardening the encapsulation material. Typically this is done such that the sensor array portion of the die is left uncovered by the encapsulation material. The encapsulated die structure may then form a component used in subsequent assembly steps.

INTEGRALLY MOLDED DIE AND BEZEL STRUCTURE FOR FINGERPRINT SENSORS AND THE LIKE

BACKGROUND

The present disclosure is related to integrated circuit packaging, and more specifically to methods and apparatus for integrally molding a die and one or more bezel structures, with portions of each exposed or at most thinly covered, for fingerprint sensors and the like.

One relatively common biometric sensing device today is the fingerprint sensor. These devices are used in controlling access to electronic devices such as computers and mobile phones, safes, buildings, vehicles, etc. by scanning a user's fingerprint and comparing it to an authenticating set of fingerprint images. If the proffered (live) fingerprint to be authenticated matches one within a set of pre-enrolled authorized fingerprints, access may be granted. Fingerprint sensors may be stand-alone devices, integrated into other devices such as PC peripherals, or may be integrated into the devices over which they control access. The sensors may be optical or electrical (e.g., resistive, capacitive, etc.)

Typical electrical-based fingerprint sensors today comprise a semiconductor body, or die, on which is formed an array of sensor elements and related circuitry. When packaged, the sensor elements are often exposed for contact with a user's finger, or through a protective material. Typically, the sensors operate according to principles that use distance between the sensor surface and a region of the user's finger to construct an image of the user's fingerprint. Accurate operation of such sensors can accommodate no more than a minimal gap between the sensor surface and the fingerprint to be sensed. Therefore, the sensor surface itself is most often left uncovered, and a user places a finger directly into contact therewith in the process of fingerprint sensing. However, certain fingerprint sensor designs include thin protective overcoats over the sensor surface to protect the sensors from physical and environmental damage, wear, etc.

The semiconductor die typically has a sensor array photolithographically (or otherwise) formed on a top surface thereof. The sensor die are typically quite small, with correspondingly small contact pads, necessitating use of a secondary structure to make practical electrical connections between the die and a printed circuit board (PCB) to which the assembly is attached for use. Such secondary structures include lead frames, chip carriers, and the like. In common applications, the die is attached to a lead frame, and fine wires (wirebonds) make the electrical interconnections between the micro-scale bonding pads of the die and the macro-scale bonding leads of the lead frame. To protect the wirebonds and other components, the die, lead frame, and wirebonds are typically encased in an encapsulation material. This is accomplished by placing the bonded and connected die and lead frame in a mold, injecting the encapsulation material into the mold, and hardening the encapsulation material. Typically this is done such that the sensor array portion of the die is left uncovered by the encapsulation material. The encapsulated die structure may then form a component used in subsequent assembly steps.

A number of fingerprint sensor circuit designs operate by injecting a small current into the finger being sensed. One example of such a circuit is disclosed in U.S. Pat. No. 6,512,381, which is incorporated herein by reference. In order to drive the user's finger with the desired current, a contact structure, for example as disclosed in U.S. Pat. No. 6,636,053, which is also incorporated herein by reference, may be provided. The contact structure may take the form of a bezel located near an edge of the die. The bezel has a generally planar upper surface that is either coplanar with or parallel to the plane of the upper surface of the die. As the user applies a fingertip to the surface of the die, for example by placement on an area sensor or in the swiping motion over a strip sensor, the fingertip is simultaneously in physical and electrical contact with the surface of the die (i.e., the sensor array formed on the top surface of the die) and the bezel, the latter to electrically drive the fingertip during the sensing process.

Traditionally, the bezel and the encapsulated die have each been separate elements, brought together in the process of assembling or packaging the sensor apparatus. That is, the bezel and die are not encapsulated together. In one known example, the bezel is a metal sheet bent to curl over at its edges, which makes electrical connection with the bottom side of the substrate. The bezel wraps around the sides of the substrate to present a top, contact portion roughly in the plane of the top surface of the encapsulated die. In other example, a metal strip or frame makes contact with the top side of the substrate, and presents a top, contact portion roughly in the plane of the top surface of the encapsulated die.

Current fingerprint sensor structures require a number of discrete assembly steps. As the number of discrete elements and manufacturing steps increase, manufacturing cost increases and the potential for faulty or inaccurate assembly that negatively affects product consistency and yield losses increase. Discrete element sub-assembly is also a more time consuming process than integrated manufacturing. As in the general art of IC production, there is significant, ongoing commercial pressure to reduce cost, number of components, and number and complexity of manufacturing steps, and size of the completed structure.

Furthermore, the separate bezel and encapsulated die structures are often undesirably large final devices. Further still, it is desired that the bezel be as physically close to the sensors as possible to optimize the sensitivity of the sensor. However, known separate bezel and encapsulated die designs limit possible options of the final device size and sensor-to-bezel spacing.

SUMMARY

According to one aspect of the present disclosure, a biometric sensor assembly, such as a fingerprint sensor, comprises a substrate to which is mounted a die containing sensor circuitry and at least one conductive bezel. As used in the description and claims that follow, "bezel" means a unitary, substantially uniformly composed structure, most typically metal or conductive plastic. The die and the bezel are encased in a unitary encapsulation structure to protect those elements from mechanical, electrical, and environmental damage, yet with a portion of a surface of the die and the bezel exposed or at most thinly covered by the encapsulation or other coating material structure.

By encasing both the bezel and the sensor die in the encapsulation structure, those elements may be brought closer together than heretofore possible. In addition, the encapsulation structure physically protects the bezel and sensor die, and in particular maintains the spacing therebetween, in a fashion not possible by currently known device designs.

According to one variation disclosed herein, the bezel may be an electrically conductive arch-shaped structures secured to a substrate. The substrate may have leadlines or the like formed thereon to allow electrically interconnection between the bezel and other circuitry. The bezel may alternatively be a solid body or part of a bezel frame. A single bezel may be integrally molded with the sensor die in an encapsulation structure or a plurality of bezels by be so molded. The bezel may be adjacent a single side of the sensor die, several sides of the sensor die, or may surround the sensor die.

The molding of the bezel and sensor die may be such that the top surface of the bezel and the top surface of the sensor die are coplanar. Alternatively, the plane of the top surface of the bezel and the top surface of the sensor die may be generally parallel, but not coplanar, such that the plane of the top surface of the bezel is slightly above the plane of the top surface of the sensor die. In this case, the top surface of the bezel may protrude slightly above the encapsulation material, for example to improve physical contact therewith by a user's finger. Also in this case, it may be desirable to provide the bezel with a slightly rounded cross-section for user comfort, for device robustness, to avoid the buildup of contaminants at the bezel edge, etc.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that description of well-known starting materials, processing techniques, components, equipment and other well-known details are merely summarized or are omitted so as not to unnecessarily obscure the details of the present invention. Thus, where details are otherwise well known, we leave it to the application of the present invention to suggest or dictate choices relating to those details.

Figure 1:
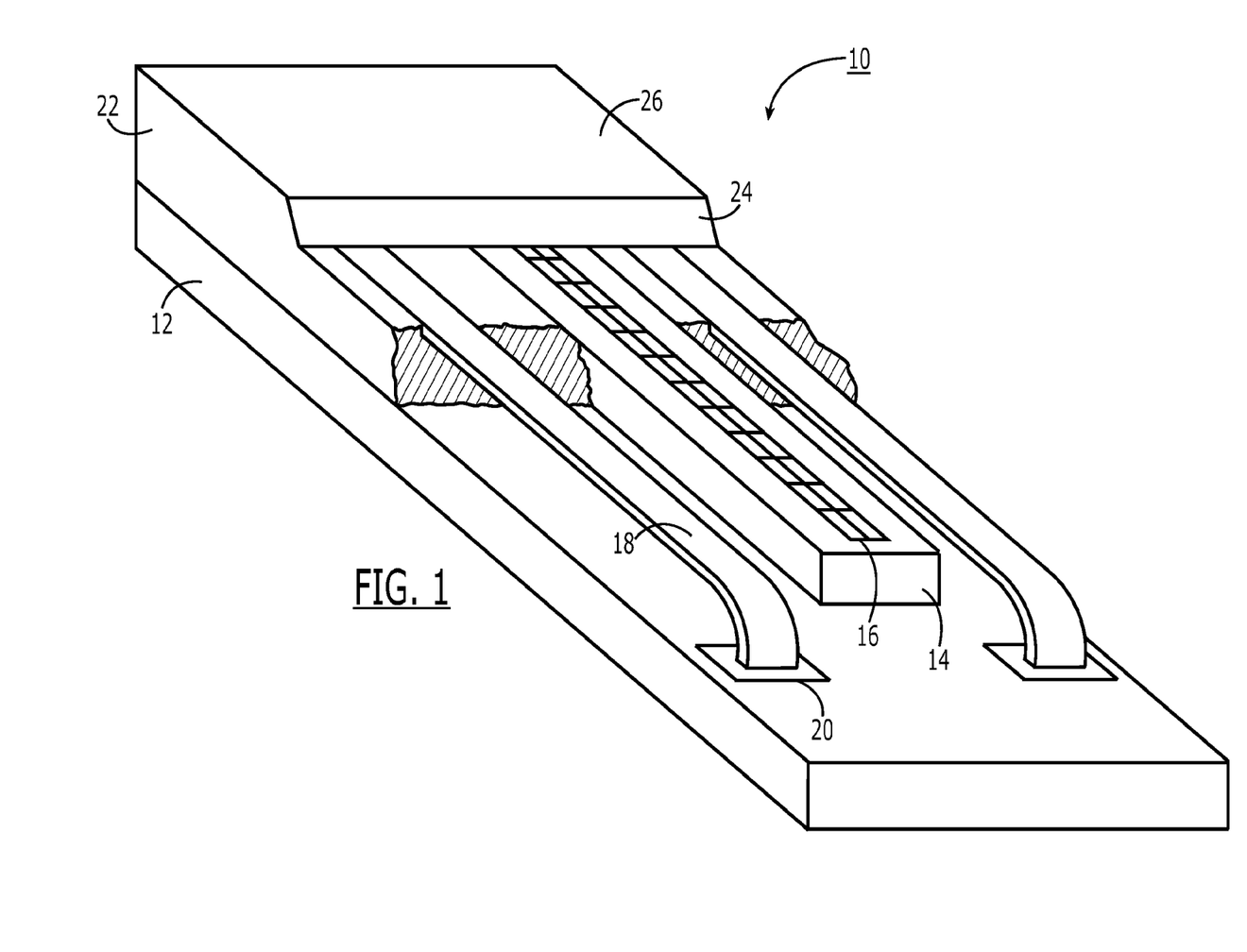
FIG. 1 is a partial cut-away perspective view of a biometric sensor assembly with integrally molded bezel and sensor die according to a first embodiment of the present disclosure.

With reference first to FIG. 1, there is shown therein a partial cut-away perspective view of a biometric sensor assembly 10 according to a first embodiment. Assembly 10 comprises a substrate 12, which may be a printed circuit board (PCB), ceramic body, or similar structure having formed thereon, and possibly in layers thereof, interconnection leads (not shown). Secured to substrate 12 in a die-receiving region is sensor integrated circuit, or die, 14. Die 14 is typically a semiconductor body have one or more layers formed thereon, including electrical devices such as transistors, capacitors, interconnections and the like formed photolithographically or by other semiconductor manufacturing processes. Specifically, die 14 has formed thereon a two-dimensional array 16 of sensor pixels and sensing circuitry. Die 14 may be physically connected to substrate 12 by an adhesive between the bottom side of die 14 and the top side of substrate 12, and electrically connected by a plurality of wirebonds from the top side of die 14 to the top side of substrate 12. Other methods may also be employed as well known in the art.

One or more bezels 18 are secured to bezel receiving regions 20 on substrate 12. Bezels 18 may be discrete individual elements, or may form part of a bezel frame (described further below). Bezels 18 may be opaque, conductive elements used, for example, to inject current into the finger of a user as the finger is being sensed by the pixels of two-dimensional array 16. In the embodiment shown in FIG. 1, bezels 18 are discrete arch (or inverted "U") shaped metal structures, which may be individually secured to bezel receiving regions 20. It should be noted that FIG. 1 is a partial cut-away of a completed structure and that each bezel in this embodiment has at least one, and typically two points of contact with substrate 12. Thus, one such point of contact is shown in the cut-away portion, while the other is within the portion of encapsulation structure 22 shown in the FIG. 1, and thus not shown. Optionally, bezels 18 may be provided with visual indicator regions (not shown) and a light source (also not shown) associated with assembly 10, as described further in U.S. Patent Application Publication No. 2011/0215341.

Die 14 and bezel 18 are embedded within encapsulation structure 22 such that a top surface of die 14, and in particular array 16, as well as a top surface of bezel 18 are at least partly exposed to a user. These top surfaces are either coplanar or are in closely spaced apart, parallel planes. Regions of these surfaces may be left uncovered by the material forming encapsulation structure 22, for example by masking over those regions during formation of the encapsulation structure 22. One or both of the top surface of array 16 and bezel 18 may alternatively be very thinly covered by material forming encapsulation structure 22, or by other coating material, in order to provide physical protection of the array and/or bezel surface, but such that capacitive sensing of the fingerprint pattern and/or conduction between bezel 18 and the user's finger is nevertheless enabled.

The material forming encapsulation structure 22 may be an insulative, semi-transparent or opaque resin or plastic of a type otherwise well known in the art. Encapsulation may be accomplished by transfer molding or other techniques. One of a variety of integrated circuit molding techniques known in the art may be employed to form encapsulation structure 22. According to one example of these techniques, disclosed in U.S. Pat. No. 6,686,227, which is incorporated herein by reference, the die is mounted to the substrate, with bonding wires (described further with reference to FIG. 5) making electrical connection between the die and substrate. The die and substrate are placed in a mold body, such that the mold body clamps the substrate to hold the assembly in place. Encapsulation material is injected into the mold body. A seal blocks encapsulation material injected into the mold from being applied to the region of surfaces that are desirably to be exposed, in the present case the upper surfaces of die 14 and bezel 18. The binding wires are encased in the encapsulation material for protection, and the regions thereover become tapered guide regions 24 and shelf regions 26. By including bezels 18 within the mold body in the molding process, and positioning the upper surfaces of bezels 18 generally coplanar or in a plane parallel with the place of upper surface of die 14, the molding process may effectively encapsulate both die 14 and bezel 18 within encapsulation structure 22 yet provide the desired exposed surface regions of die 14 and bezel 18.

Encapsulation structure 22 will substantially cover the top surface of substrate 12. It may also extend to the sides of substrate 12. The back side of substrate 12 may be provided with conductive bump contacts (e.g., ball grid array or land grid array, not shown) for back-side interconnection to a printed circuit board or other component mounting assembly as part of final device construction. Alternatively, the back side or top side of substrate 12 may be provided with contact pads or pins, which are left exposed following the molding process to permit electrical interconnection of the molded subassembly within another electrical system. A complete biometric sensor assembly with integrally molded bezel and sensor die is thus obtained.

Figure 2A:
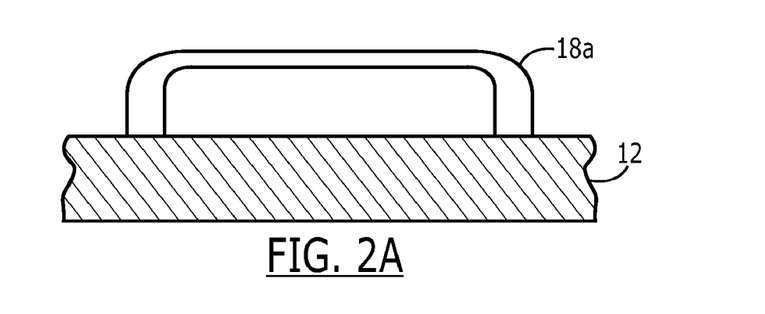
FIGS. 2A and 2B are side elevation views of two different bezels located on a substrate according to two embodiments of the present disclosure.
Figure 2B:
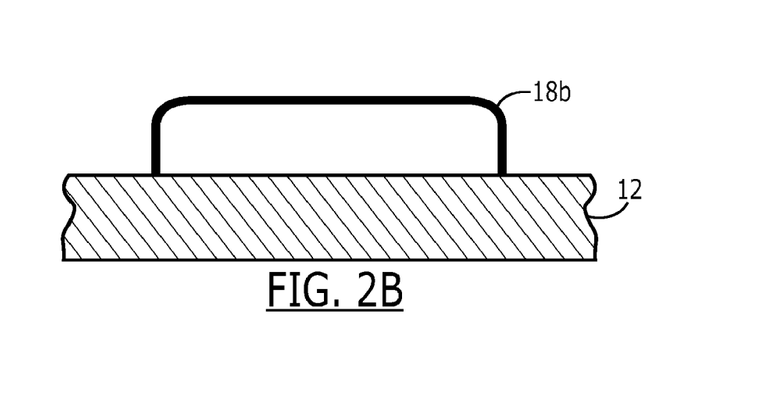

The description above of a biometric sensor includes one or more bezels 18 mounted to substrate 12. FIG. 2A illustrates one exemplary embodiment of a bezel 18a having an arch (or inverted "U") shape when viewed from the side. FIG. 2B illustrates another exemplary embodiment of a bezel 18b which is a solid rectangular structure, for example with rounded corners, when viewed from the side. While the specific cross-sectional shape of bezel 18 in no way limits the scope of the present disclosure, the present disclosure is unique in that a structure and method making that structure are provided in which a bezel located proximate sensor circuitry is unitarily disposed within an encapsulation structure. Physical and environmental protection of the structural elements of the assembly is provided by the encapsulation structure. Furthermore, the bezel may be located much closer to the sensor die than heretofore possible.

Figure 3A:
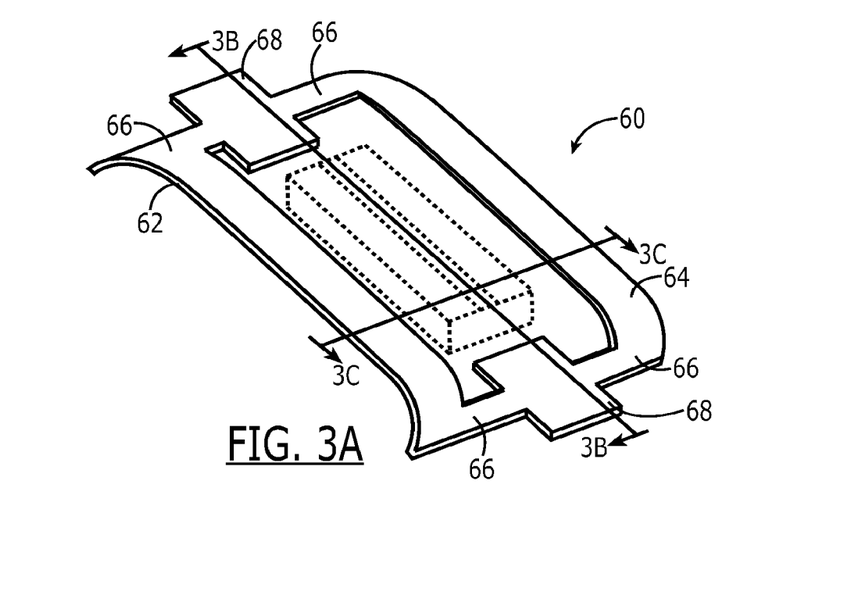
FIG. 3A is a perspective view and FIGS. 3B and 3C are side elevation and front views, respectively, of a bezel frame according to an embodiment of the present disclosure.
Figure 3B:
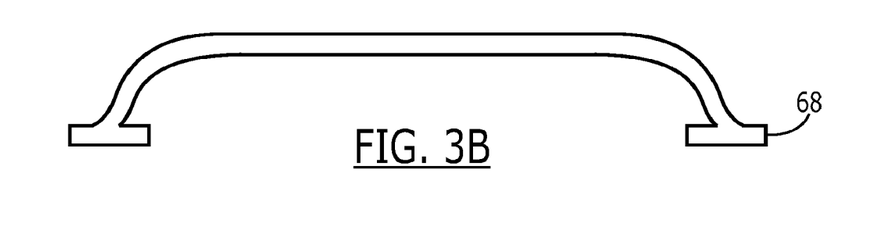
Figure 3C:
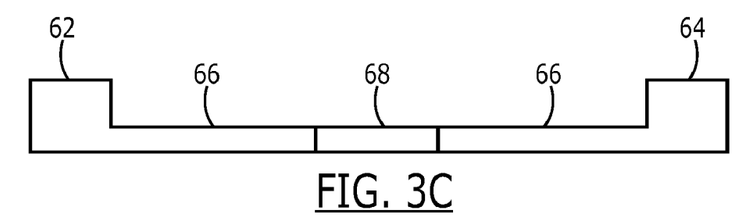

While the embodiment shown in FIG. 1 includes two bezels 18, each individually and discretely located on substrate 12, according to one variation of the disclosure herein, only a single bezel is employed. According to one further variation, the bezel(s) may form a portion of an integrated lead frame and bezel structure as described in United States Application Publication number 2010/0127366, which is incorporated herein by reference. An example of such a bezel frame 60 is illustrated in FIGS. 3A, 3B, and 3C. Bezel frame 60 includes first bezel 62 and second bezel 64, with connecting arms 66 connecting bezels 62, 64 to contact and bonding pads 68. Again, one or more than two bezels may similarly be provided, although such embodiments are not separately illustrated.

In the case of a single bezel or a plurality of bezels integrally molded with the sensor die, the bezel(s) may be adjacent a side(s) of the sensor die. Again, due to the fact that the bezel(s) is positioned relative to the sensor die prior to the molding of the sensor die, the bezel(s) may be made closer to the sensor die than heretofore possible.

Figure 4:
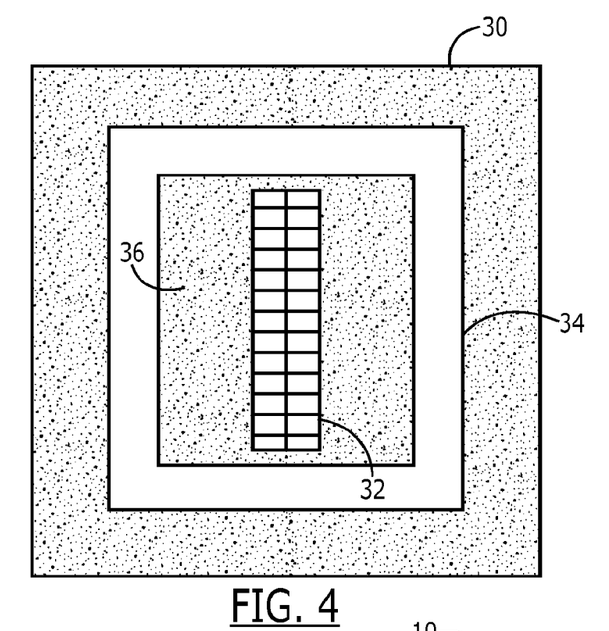
FIG. 4 is a top or plan view of a biometric sensor with integrally molded bezel and sensor die according to another embodiment of the present disclosure.

While described above as being located proximate the sides of the sensor die, the bezel(s) may fully surround the sensor die. For example, the bezel may be closed structure, such as a rectangle, oval, etc. having an opening in its center in which the sensor die is positioned. This embodiment is illustrated in FIG. 4, in which a substrate 30 has secured thereto a sensor die 32 and a closed bezel structure 34, in this case of rectangular planform, having an opening 36 in which sensor die 32 is disposed and through which the upper surface of sensor die 32 is presented. The entirety of the surface of substrate 30 to which sensor die 32 and bezel 34 are secured is covered with encapsulation material (not shown), leaving the top surfaces of sensor die 32 and bezel 34 exposed or at most thinly covered by the encapsulation material.

Figure 5:
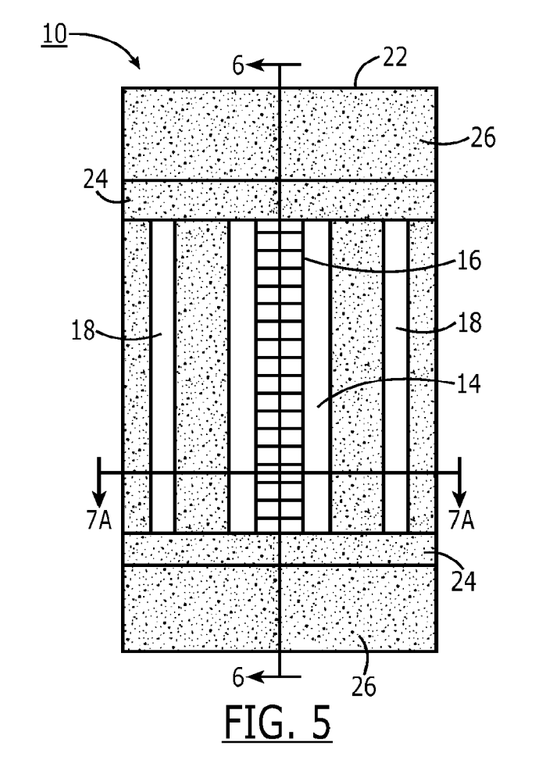
FIG. 5 is a top or plan view of the biometric sensor with integrally molded bezel and sensor die illustrated in FIG. 1.
Figure 6:
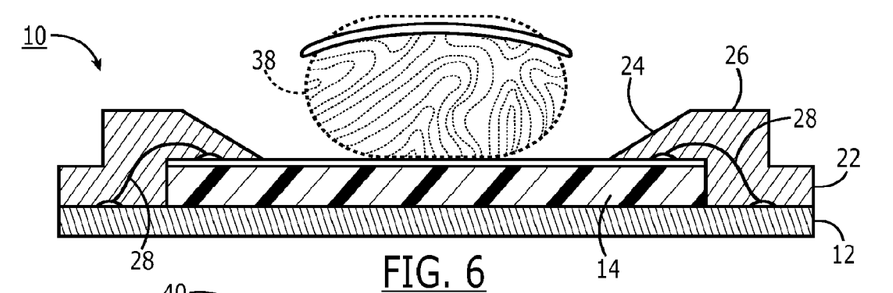
FIG. 6 is a front elevation view of the biometric sensor with integrally molded bezel and sensor die illustrated in FIG. 1.

With reference to FIGS. 5, 6, and 7A through 7C, there is shown therein a plan view and a number of cut-away cross-sectional views, respectively, of a integrally molded die and bezel structure for fingerprint sensors and the like according to an embodiment of the present invention. More specifically, FIG. 5 is a plan view of the biometric sensor assembly 10 shown in perspective view in FIG. 1. FIG. 6 is a cut-away cross sectional view of assembly 10, viewed in the axial direction of a user's finger 38. As can be seen from FIG. 6, die 14 is physically mounted to substrate 12, and electrically connected thereto by wirebonds 28. Alternatively, die 14 may be physically and electrically connected to substrate 12 by adhesive and wirebonds, respectively. Die 14, bezels 18, wirebonds 28, etc. are molded so as to protect wirebonds 28 and portions of die 14 and bezels 18 under guide regions 24 and shelf regions 26. Importantly, as molded, a portion of the upper surface of die 14, e.g., sensor die 16, is exposed to permit physical contact with finger 38. The encapsulation material may also thinly cover this region of die 14 provided the operational principles (e.g., capacitive sensing) on which the sensing function of sensor die 16 operates is not significantly degraded.

Figure 7A:
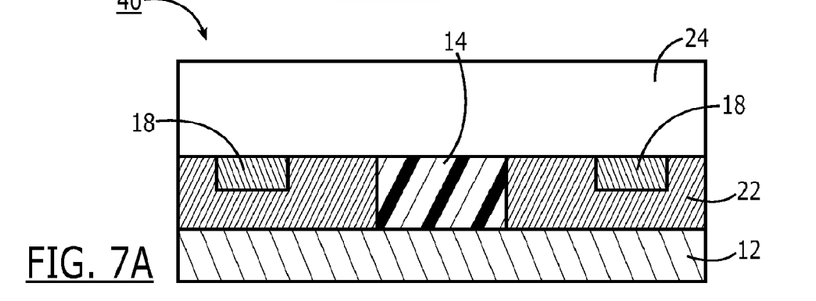
FIGS. 7A through 7C are side elevation views of three different embodiments, respectively, of a biometric sensor with integrally molded bezel and sensor die according to various embodiments of the present disclosure.
Figure 7B:
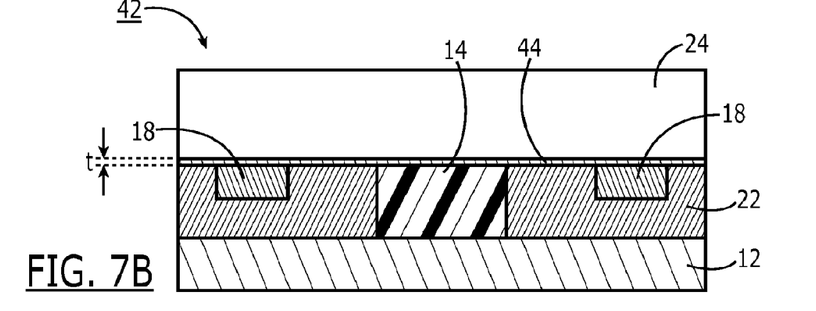
Figure 7C:
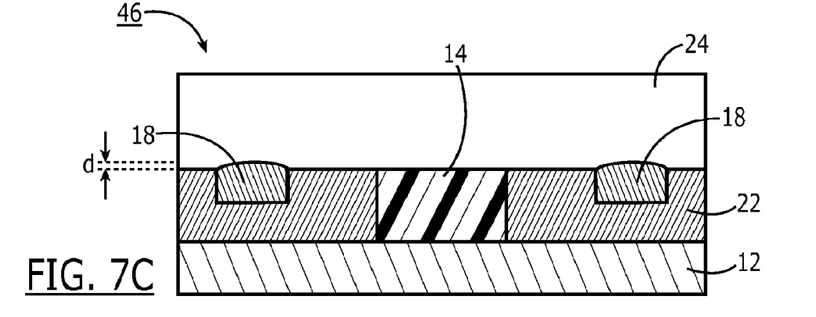

With reference to FIGS. 7A through 7C, various embodiments of the elevation of bezels 18 relative to the top surface of die 14 can be seen. In embodiment 40 shown in FIG. 7A, the molding may be such that the top surface of bezel 18 and the top surface of die 14 are coplanar. In this embodiment, the molding is further controlled such that the top surfaces of die 14 and bezels 18 are exposed (i.e., not covered by encapsulation material) so that a user's finger (not shown) may by in physical contact therewith. Alternatively, in embodiment 42 shown in FIG. 7B, while the planes of the top surfaces of the die 14 and bezel 18 are coplanar, the molding is controlled so that a thin layer of encapsulation material 44 (thickness t) is formed thereover, for example for physical protection of the sensor die 16 and/or bezel 18.

In embodiment 46 shown in FIG. 7C, the plane of the top surface of die 14 and the plane of the top surface of bezels 18 are not coplanar. The plane of the top surface of bezels 18 is slightly above the plane of the top surface of die 14 (by distance d). In this case, the top surface of bezels 18 may protrude slightly above the encapsulation material 22, for example to improve physical contact therewith by a user's finger (not shown). Also in this case, it may be desirable to provide bezels 18 with a slightly rounded top surface (shown in cross-section in FIG. 7C) or corners for user comfort, for device robustness, to avoid the buildup of contaminants at the bezel edge, etc.

Figure 8A:
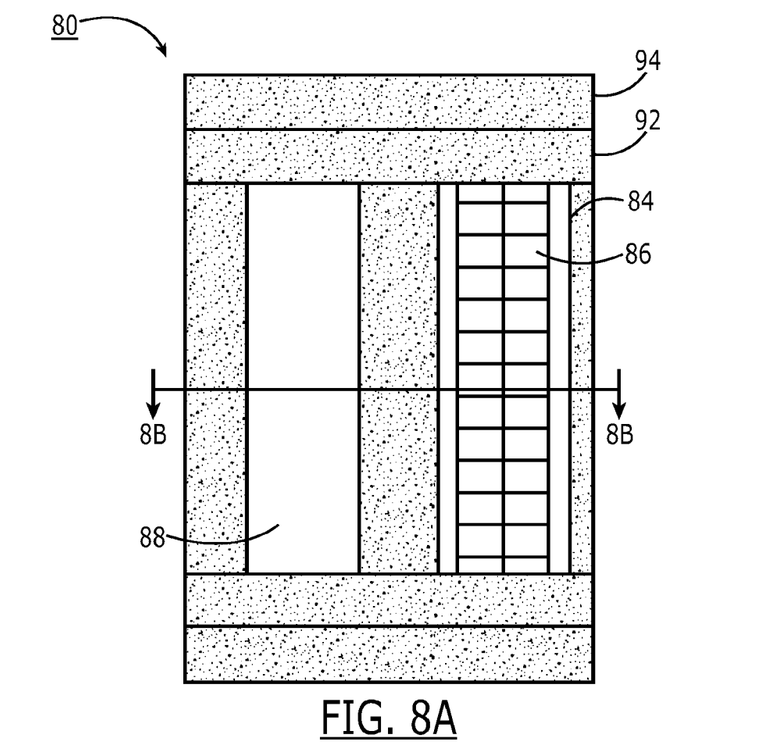
FIGS. 8A and 8B are a top plan view and side elevation view of another embodiment of a biometric sensor with integrally molded bezel and sensor die according to the present disclosure.
Figure 8B:
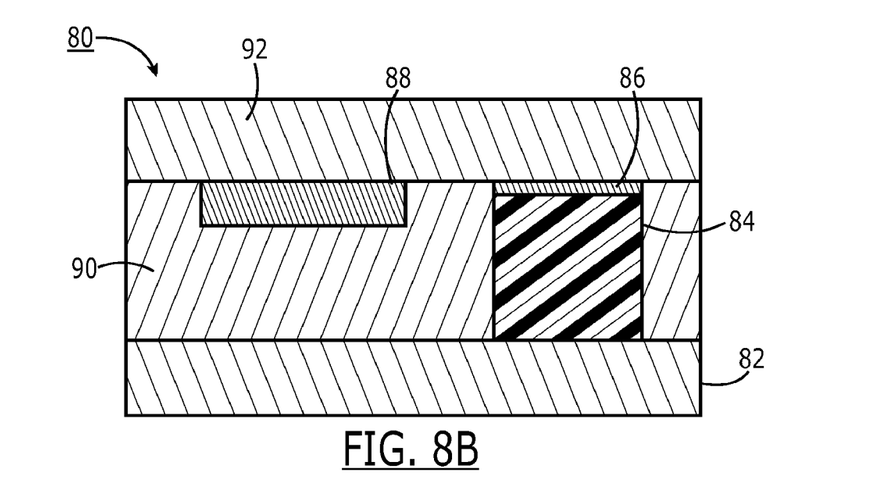

In embodiment 80 shown in FIGS. 8A and 8B, a substrate 82 has physically connected thereto a die 84. The connection may also be electrical, as described above. Die 84 has formed therein a sensor region 86, also as described above. A bezel 88 is also physically, and optionally electrically, connected to substrate 82. In embodiment 80, only a single bezel 88 is provided, as compared for example to embodiment 10 shown in FIG. 1 in which two bezels 18 are shown. Finally, as previously described, die 84 and bezel 88 are surrounded by encapsulation material 90, which is molded to form, for example, tapered guide regions 92 and shelf regions 94. Again, die 84 and bezel 88 are embedded within encapsulation structure 90 such that a top surface of die 84, and in particular array 86, as well as a top surface of bezel 88 are at least partly exposed to a user. Alternatively, the top surfaces of die 84 and bezel 88 may be thinly covered by encapsulation material.

Figure 9:
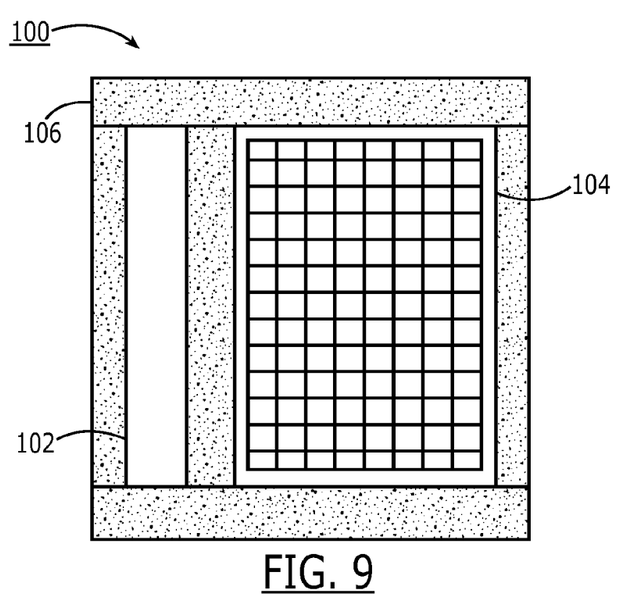
FIG. 9 is a top plan view of an area-based biometric sensor with integrally molded bezel and sensor die according to another embodiment of the present disclosure.
Figure 10:
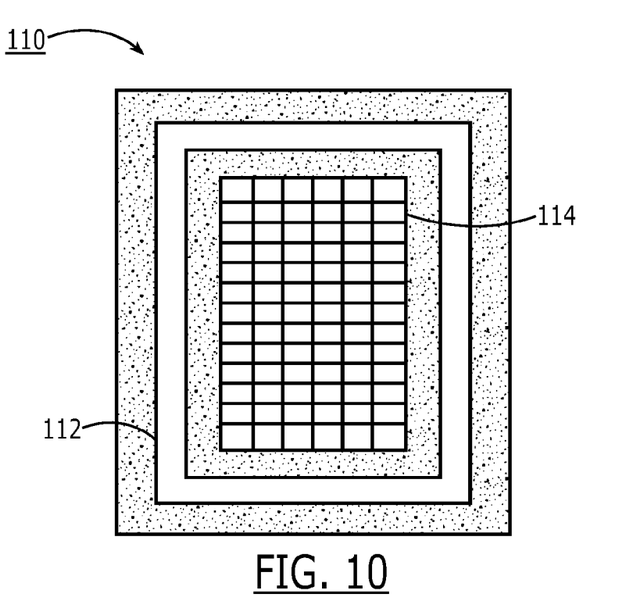
FIG. 10 is a top plan view of an area-based biometric sensor with integrally molded bezel and sensor die according to yet another embodiment of the present disclosure.

The foregoing description has assumed that the sensor device is of a type that is, when viewed from above, approximately the width of an average user's fingertip, but only several pixels tall, typically between 1 and 8 pixels, and possibly as many as 16 pixels tall. Such sensors are typically referred to as strip sensors. In operation, a user swipes a finger over a surface of the sensor. The sensor captures a number of thin strips of the fingerprint as the finger is swiped, and the complete fingerprint is assembled in software for use in authentication. Such a sensor apparatus is typically preferred when a compact sensor is desired. However, the present disclosure is not limited to strip sensors. For example, with reference to FIG. 9, there is shown therein an embodiment 100 of an integrally molded bezel and sensor die wherein the sensor is of a type that is, when viewed from above, approximately the width and length of an average user's fingertip. In operation, the user holds their fingertip in place over the sensor area, and the fingerprint is scanned, typically in raster fashion. Such sensors are typically referred to as area sensors. For illustration purposes, embodiment 100 comprises a single bezel 102 and an area sensor die 104, integrally molded in an encapsulation structure 106. It will, however, be appreciated that more than one bezel 102 can be used in a similar embodiment. Similarly, a second area sensor embodiment 110 is shown in FIG. 10, in which a bezel 112 in the form of a rectangular ring fully surrounds an area sensor die 114, integrally molded in an encapsulation structure 116.

Accordingly, various embodiment of an integrally molded die and bezel structure for fingerprint sensors and the like have been disclosed. These various embodiments highlight the scope and breadth of the claims that follow. However, the physics of modern electrical devices and the methods of their production are not absolutes, but rather statistical efforts to produce a desired device and/or result. Even with the utmost of attention being paid to repeatability of processes, quality of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein and in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of exemplary embodiments have been presented in the foregoing detailed description, it should be understood that a vast number of variations exist, and these exemplary embodiments are merely representative examples, and are not intended to limit the scope, applicability or configuration of the disclosure in any way. Various of the above-disclosed and other features and functions, or alternative thereof, may be desirably combined into many other different arrangements or embodiments, and potentially find alternative applications. Further still, various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A fingerprint sensor device, comprising:
   a substrate;
   a die comprising fingerprint sensing circuitry and being secured to said substrate;
   a first conductive bezel secured to said substrate adjacent said die; and
   an encapsulation structure integrally encasing at least a portion of said die and a portion of said first conductive bezel;
   said die including a top surface configured to be electrically coupled with a fingertip;
   said first conductive bezel including a top surface positioned with respect to the top surface of said die and configured to be electrically coupled with the fingertip.

2. The fingerprint sensor of claim 1, wherein said encapsulation structure partially encases said first conductive bezel such that at least the top surface of said first conductive bezel is not encased therewith.

3. The fingerprint sensor of claim 2, wherein said fingerprint sensing circuitry comprises a sensor array for sensing a fingerprint pattern of a user, and wherein said encapsulation structure partially encases said die such that said sensor array is uncovered and exposed for physical contact.

4. The fingerprint sensor of claim 3, wherein said sensor array defines a component of a fingerprint strip sensor.

5. The fingerprint sensor of claim 3, wherein said sensor array defines a component of a fingerprint area sensor.

6. The fingerprint sensor of claim 1, wherein said encapsulation structure fully encases said die and first conductive bezel such that the top surface of each of said die and said first conductive bezel are encased by a portion of said encapsulation structure which is relatively thinner than the remainder of said encapsulation structure.

7. The fingerprint sensor of claim 6, wherein said fingerprint sensing circuitry comprises a sensor array for capacitively sensing a fingerprint pattern of a user, and wherein said encapsulation structure encases said die such that said sensor array is thinly encased by said encapsulation structure such that the thickness of said encapsulation structure over said sensor array does not reduce the sensitivity of the sensor array in a manner that substantially prevents the possibility of said sensor array to capacitively sense a fingerprint of a finger in physical contact with said encapsulation structure over said sensor array.

8. The fingerprint sensor of claim 7, wherein said sensor array defines a component of a fingerprint strip sensor.

9. The fingerprint sensor of claim 7, wherein said sensor array defines a component of a fingerprint area sensor.

10. The fingerprint sensor of claim 1, further comprising:
a second conductive bezel secured to said substrate;
wherein said encapsulation structure further integrally encases at least a portion of said second conductive bezel with said die and said first conductive bezel.

11. The fingerprint sensor of claim 10, wherein said first conductive bezel and said second conductive bezel define portions of a bezel frame, and further wherein said bezel frame is physically coupled to said substrate.

12. The fingerprint sensor of claim 11, wherein said bezel frame is electrically coupled to said die by way of said substrate.

13. The fingerprint sensor of claim 12, wherein said bezel frame defines an opening in which said die is located such that said die is surrounded by said bezel frame.

14. The fingerprint sensor of claim 1, wherein said first conductive bezel is electrically coupled to said die by way of said substrate.

15. A fingerprint sensor assembly comprising:
a substrate;
a die comprising a fingerprint sensing array and secured to said substrate;
a first conductive bezel secured to said substrate adjacent said die;
a second conductive bezel secured to said substrate adjacent said die such that said die is between said first and second conductive bezels; and
an encapsulation structure integrally encapsulating said die, said first conductive bezel, and said second conductive bezel, such that said fingerprint sensing array and at least a portion of a top surface of each of said first conductive bezel and said second conductive bezel are configured to be electrically coupled with a fingertip.

16. The fingerprint sensor assembly of claim 15, wherein said first conductive bezel and said second conductive bezel are each electrically coupled to said die by way of said substrate.

17. The fingerprint sensor assembly of claim 15, wherein said encapsulation structure partially encases said die such that said fingerprint sensing array is uncovered and exposed for physical contact.

18. The fingerprint sensor assembly of claim 17, wherein said fingerprint sensing array defines a component of a fingerprint strip sensor.

19. The fingerprint sensor of claim 17, wherein said fingerprint sensing array defines a component of a fingerprint area sensor.

20. The fingerprint sensor assembly of claim 15, wherein said first conductive bezel and said second conductive bezel define portions of a bezel frame physically coupled to said substrate.

21. The fingerprint sensor assembly of claim 20, wherein said bezel frame is electrically coupled to said die by way of said substrate.

22. The fingerprint sensor assembly of claim 21, wherein said bezel frame defines an opening in which said die is located such that said die is surrounded by said bezel frame.

23. A method of making a fingerprint sensor device, the method comprising:
securing a die comprising fingerprint sensing circuitry to a substrate;
securing a first conductive bezel to said substrate adjacent said die; and
integrally encasing at least a portion of said die and a portion of said first conductive bezel with an encapsulation structure;
said die including a top surface configured to be electrically coupled with a fingertip;
said first conductive bezel including a top surface positioned with respect to the top surface of said die and configured to be electrically coupled with the fingertip.

24. The method of claim 23, wherein said encapsulation structure partially encases said first conductive bezel such that at least the top surface of said first conductive bezel is not encased therewith.

25. The method of claim 23, wherein said fingerprint sensing circuitry comprises a sensor array for sensing a fingerprint pattern of a user, and wherein said encapsulation structure partially encases said die such that said sensor array is uncovered and exposed for physical contact.

26. The method of claim 25, wherein said sensor array defines a component of a fingerprint strip sensor.

27. The method of claim 25, wherein said sensor array defines a component of a fingerprint area sensor.

28. The method of claim 23, further comprising:
securing a second conductive bezel to said substrate;
wherein said encapsulation structure further integrally encases at least a portion of said second conductive bezel with said die and said first conductive bezel.

29. The method of claim 28, wherein said first conductive bezel and said second conductive bezel define portions of a bezel frame, and further wherein said bezel frame is physically coupled to said substrate.

30. The method of claim 29, wherein said bezel frame is electrically coupled to said die by way of said substrate.

31. The method of claim 29, wherein said bezel frame defines an opening in which said die is located such that said die is surrounded by said bezel frame.

32. The method of claim 23, wherein said first conductive bezel is electrically coupled to said die by way of said substrate.

* * * * *